United States Patent [19]

Kohmura et al.

[11] Patent Number: 4,991,542
[45] Date of Patent: Feb. 12, 1991

[54] METHOD OF FORMING A THIN FILM BY PLASMA CVD AND APAPRATUS FOR FORMING A THIN FILM

[75] Inventors: Yukio Kohmura, Chiba; Yoshinori Ishida, Ichihara; Takuya Nishimoto, Yokohama, all of Japan

[73] Assignee: The Furukawa Electric Co., Ltd., Tokyo, Japan

[21] Appl. No.: 368,312

[22] PCT Filed: Oct. 14, 1988

[86] PCT No.: PCT/JP88/01043
§ 371 Date: Jun. 12, 1989
§ 102(e) Date: Jun. 12, 1989

[30] Foreign Application Priority Data

| Oct. 14, 1987 | [JP] | Japan | 62-257429 |
| Oct. 14, 1987 | [JP] | Japan | 62-257430 |
| Nov. 17, 1987 | [JP] | Japan | 62-288325 |
| Dec. 22, 1987 | [JP] | Japan | 62-194548[U] |
| Dec. 23, 1987 | [JP] | Japan | 62-325748 |

[51] Int. Cl.$^5$ .............................. C23C 16/50
[52] U.S. Cl. .................... 118/723; 118/728
[58] Field of Search ................ 118/723, 728

[56] References Cited

U.S. PATENT DOCUMENTS

| 4,317,844 | 3/1982 | Carlson | 118/723 |
| 4,625,678 | 12/1986 | Shioya | 118/723 |
| 4,668,365 | 5/1987 | Foster | 118/723 |

FOREIGN PATENT DOCUMENTS

| 60-218826 | 11/1985 | Japan . |
| 61-006277 | 1/1986 | Japan . |
| 61-015974 | 1/1986 | Japan . |
| 61-164224 | 7/1986 | Japan . |

*Primary Examiner*—Richard Bueker
*Assistant Examiner*—Richard Bueker
*Attorney, Agent, or Firm*—Frishauf, Holtz, Goodman & Woodward

[57] ABSTRACT

With the method and apparatus for forming a thin film by plasma CVD according to this invention, a substrate is disposed between a pair of feed-gas supplying electrodes, and plasma is generated by applying a high frequency electric power to the substrate as an object to be processed. Feed gas is supplied from the feed-gas supplying electrodes into the plasma and is activated, whereby a film is formed on the substrate. Therefore, a solid and fine thin film which has corrosion-resistive and abrasion-resistive properties is formed on the substrate.

5 Claims, 10 Drawing Sheets

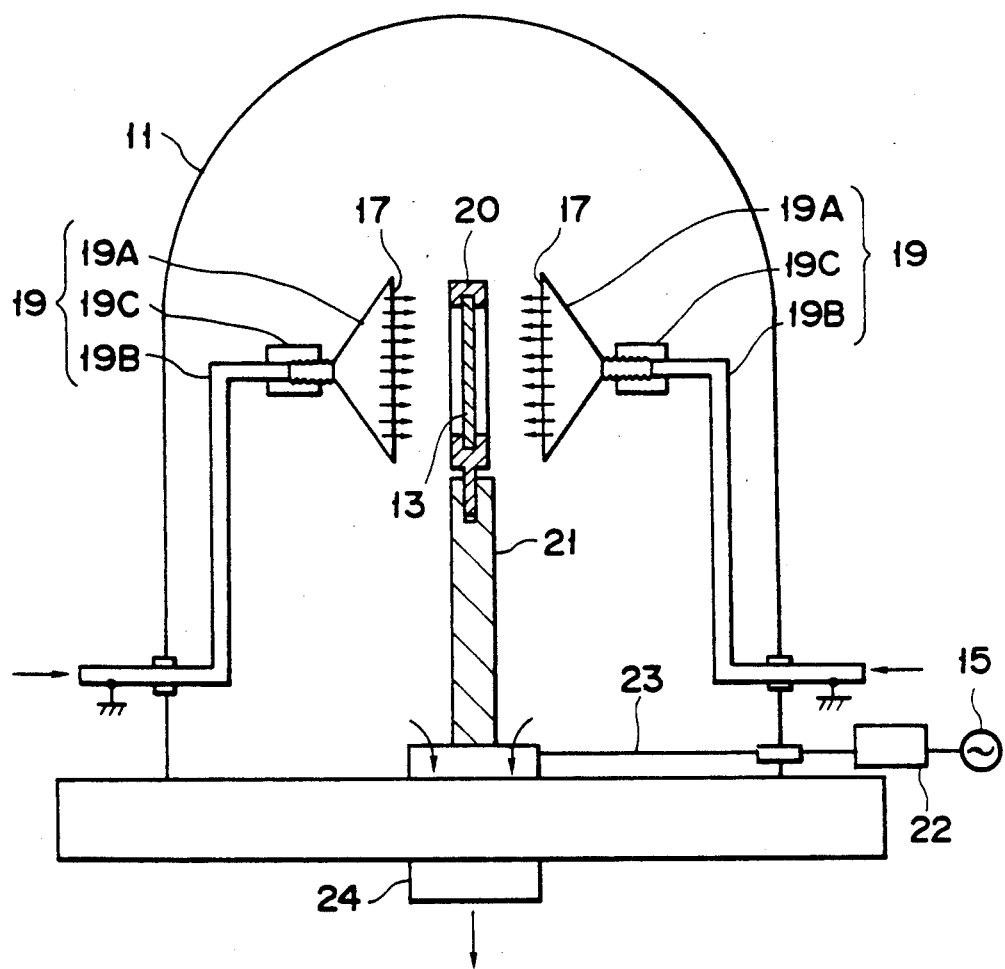
F I G. 1
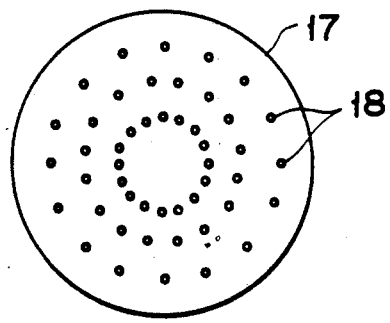
F I G. 2

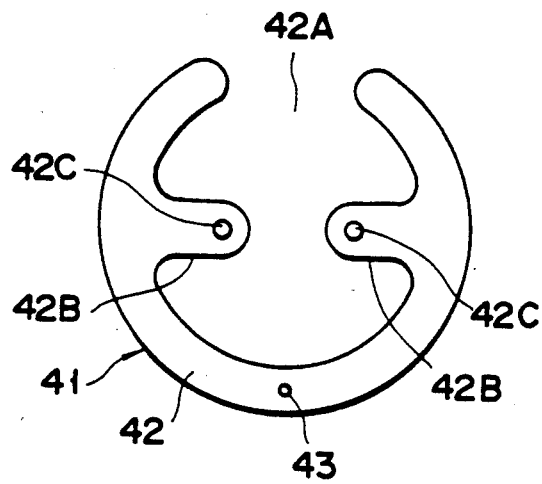
F I G. 10
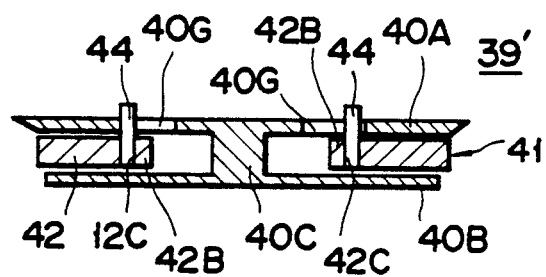
F I G. 11
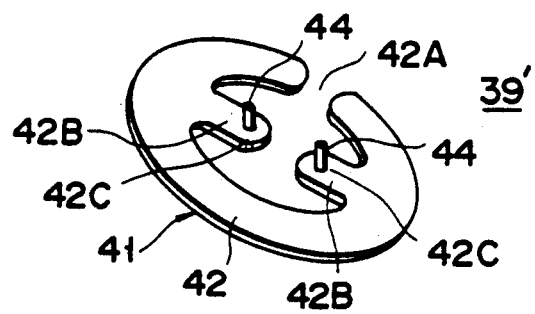
F I G. 12
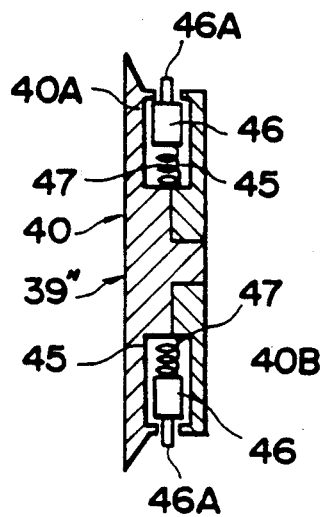
F I G. 13
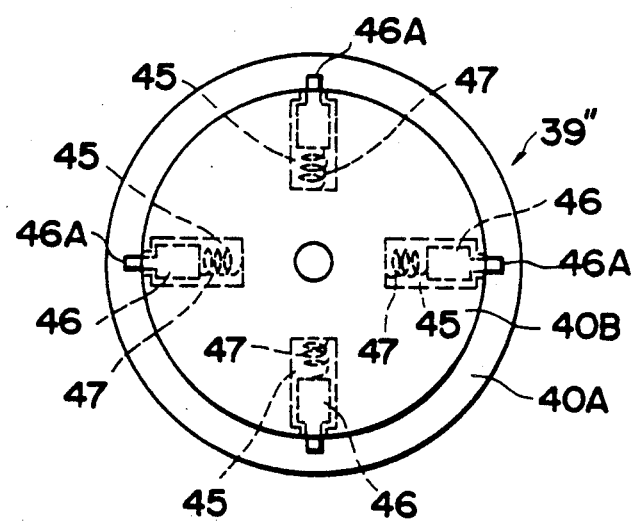
F I G. 14

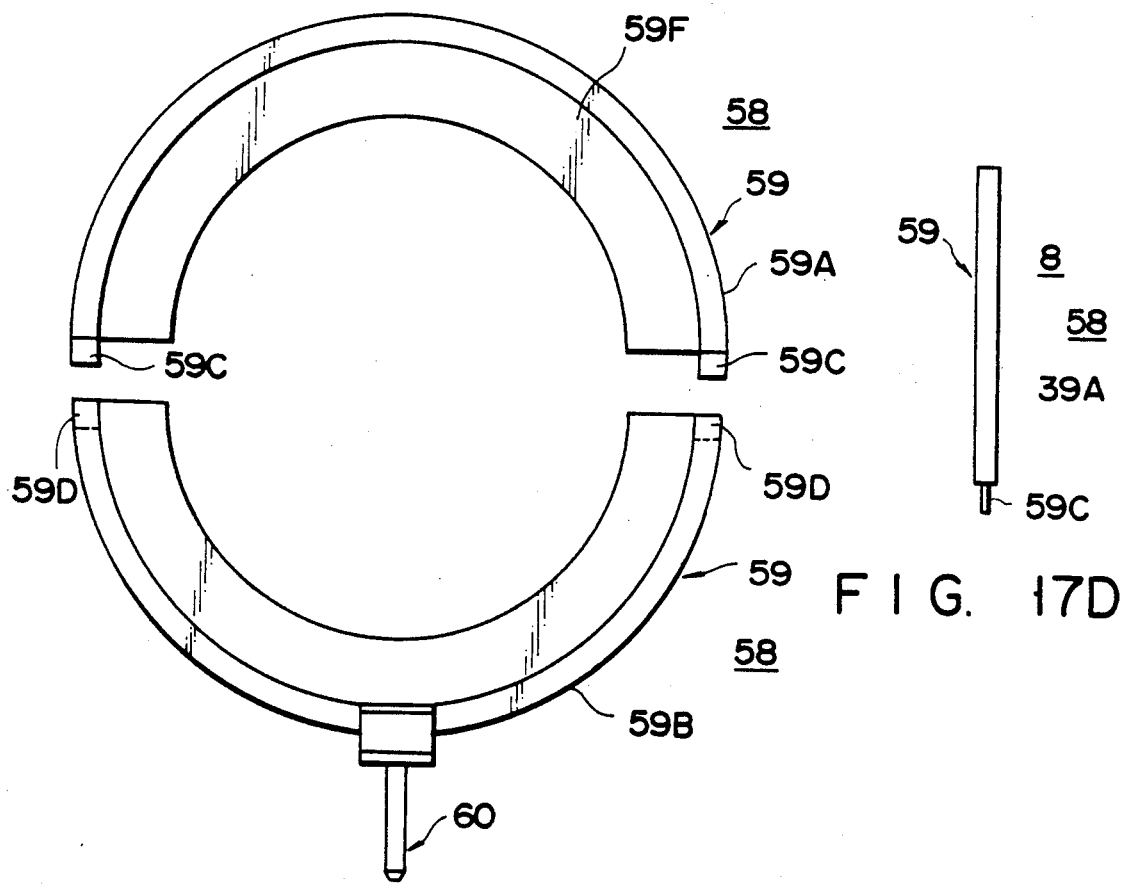
FIG. 17A
FIG. 17D
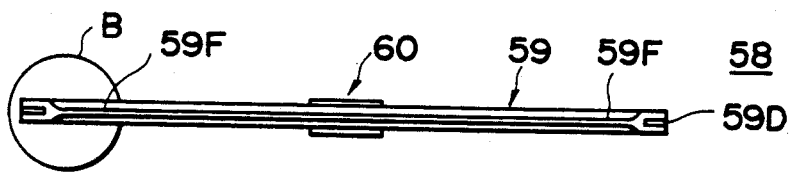
FIG. 17B
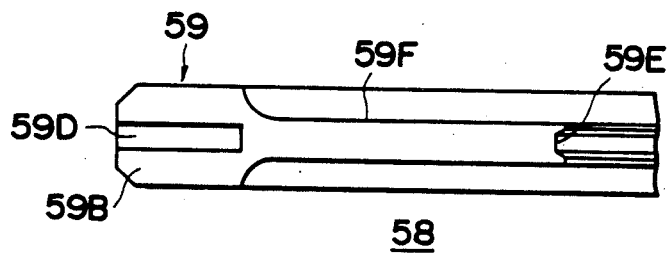
FIG. 17C
FIG. 17E

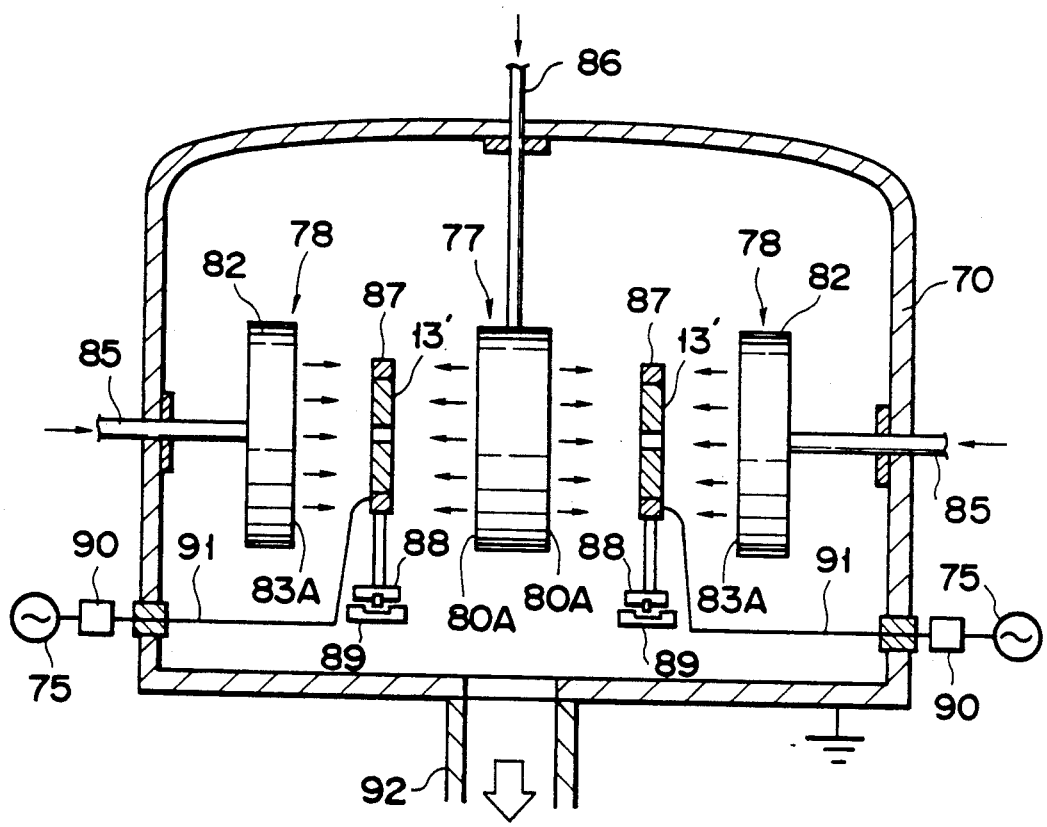
FIG. 20
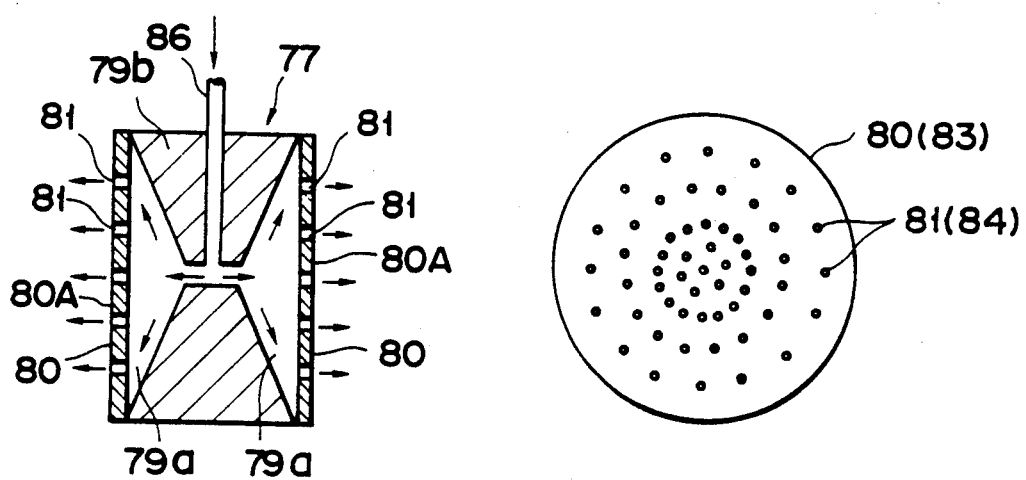
FIG. 21
FIG. 22

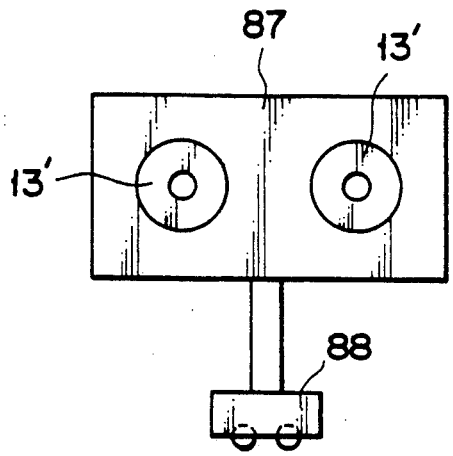
F I G. 23
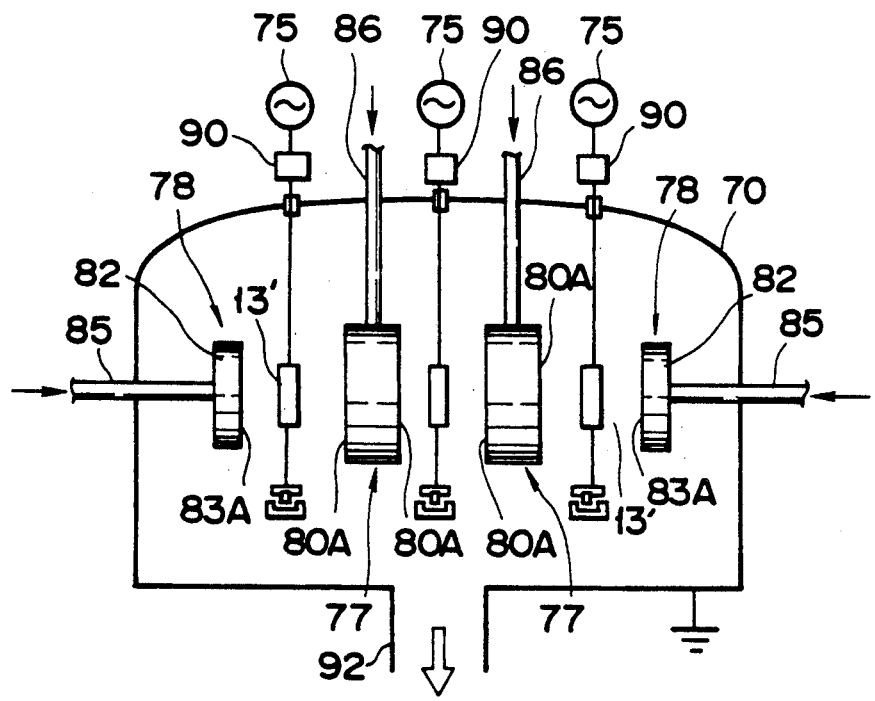
F I G. 24

METHOD OF FORMING A THIN FILM BY PLASMA CVD AND APPARATUS FOR FORMING A THIN FILM

<TECHNICAL FIELD>

This invention relates to a method of forming a thin film on a substrate by plasma CVD (chemical vapor deposition) and an apparatus for forming a thin film.

<BACKGROUND ART>

A conventional plasma generator for forming a thin film on a substrate by plasma is disclosed in the Japanese Patent Application No. 60-1279578 (the U.S. patent application Ser. No. 692,145). The major surface of the substrates which are processed on the CVD generator, has electrically conductive portions such that the generator produces substantially uniform plasma. Two opposed electrodes are provided on either one of the major surfaces. A first radio frequency source and a second radio frequency source are electrically connected to the first and second electrodes, respectively. Hereinafter, the radio frequencies are called as high frequencies in this description. The first high frequency source is out of phase from the second high frequency source.

However, with this conventional CVD generator, a solid and fine thin-film which exhibits high corrosion-resistive and abrasion-resistive properties can not yet easily have been formed on the substrate.

<DISCLOSURE OF THE INVENTION>

The object of this invention is to provide a method of forming a solid and fine thin-film having high corrosion-resistive and abrasion-resistive properties on a substrate by plasma CVD and an apparatus for forming such a thin film.

According to this invention, there is provided a method of forming a thin film by plasma CVD, comprising the steps of:

disposing an object to be processed between feed-gas supplying electrodes arranged facing each other at a predetermined spacing in a vacuum reaction chamber;

supplying a predetermined high frequency electric power to the object to be processed while feed gas is being fed from the feed-gas supplying electrodes to the object to be processed and the feed-gas supplying electrodes are being grounded; and forming a thin film on the object by plasma produced from the feed gas by the high frequency electric power.

This invention also provides a method of forming a thin film by plasma CVD, comprising the steps of:

disposing an object to be processed between a pair of current-supplying electrodes provided in an opposed relation to each other at a predetermined interval defined between feed-gas supplying electrodes arranged facing to each other at a predetermined region in a vacuum reaction chamber;

supplying a high frequency electric power to the current-supplying electrodes while feed gas is being fed from the feed-gas supplying electrodes to the object to be processed and the gas-feeding electrodes are being grounded; and forming a thin film on the object by plasma produced from the feed gas by the high frequency electric power.

This invention further provides an apparatus for forming a thin film by plasma CVD, comprising:

feed-gas supplying electrodes disposed facing each other at a predetermined spacing in a vacuum reaction chamber;

feed-gas supplying means connected to said feed-gas supplying electrodes;

supporting means for supporting an object to be processed in a predetermined position between the feed-gas supplying means; and high frequency electric power supplying means for supplying a predetermined high frequency electric power to the object to be processed while the feed-gas supplying means is being grounded.

The invention still further provides an apparatus for forming a thin film by plasma CVD, comprising:

feed-gas supplying electrodes disposed facing to each other at a predetermined spacing in a vacuum reaction chamber;

feed-gas supplying means connected to the feed-gas supplying electrodes;

supporting means for supporting an object to be processed in a predetermined position between the feed-gas supplying electrodes;

high frequency electric power supplying means for supplying a predetermined high frequency electric power to the object to be processed while the feed-gas supplying electrodes are being grounded;

a fit-engagement disc member having the substantially same thickness as that of the object to be processed and fitted in a central hole formed therein; and an inner work holder comprising expansible engaging means mounted on the fit-engagement disc member and supporting the the object to be processed thereon.

This invention still further comprises an apparatus for forming a thin film by plasma CVD, comprising:

feed-gas supplying electrodes disposed facing each other in a predetermined spacing in a vacuum reaction chamber;

feed-gas supplying means connected to the feed-gas supplying electrodes;

supporting means for supporting an object to be processed which is disposed in a predetermined position between the feed-gas supplying electrodes;

high frequency electric power supplying means for supplying a high frequency electric power to the object to be processed while the feed-gas supplying electrodes are being grounded; and an annular outer work holder provided with a uniformly thick portion having the substantially same thickness as that of the object to be processed and abutting against an outer surface thereof, the outer work holder being adapted to hold the object to be processed such that both faces of the object to be processed are exposed.

With the method and apparatus for forming a thin film by plasma CVD according to this invention, not less than three feed-gas supplying electrodes may be used, and objects to be processed may be disposed between the adjacent feed-gas supplying electrodes.

It is preferred that feed-gas should be rendered to flow out from a great number of feed-gas supplying holes formed in the opposed surfaces of the feed-gas supplying electrodes.

The object to be processed can be made of material for a magnetic disc.

Current-supplying electrodes may be disposed between the feed-gas supplying electrode and grounded. Thereafter, a predetermined high frequency electric power may be applied to the current-supplying electrodes. In this case, meshed electrodes may be used as the current-supplying electrodes.

Further, an inner work holder may be used which comprises a fit-engagement disc member having the substantially same thickness as that of the object to be processed and fitted in a central hole formed therein, and expansible engaging means for supporting the fit-engagement disc member on the object to be processed. In this case, the expansible engaging means may hold the fit-engagement disk member on the object to be processed by means of the biasing force of a spring.

Still further, an outer work holder may be used which is provided with a uniformly thick portion having the substantially same thickness as that of the object to be processed and abutting against the outer surface of the object such that both surfaces of the object are exposed.

With the method and apparatus for forming a thin film by plasma CVD according to this invention, the feed gas is supplied from both the feed-gas supplying electrodes to the object to be processed in the plasma so as to be activated, and a film is formed on the object in this state. Therefore, a solid and fine thin film which has corrosion-resistive and abrasion-resistive properties is easily formed on the object to be processed.

<BRIEF DESCRIPTION OF DRAWINGS>

FIG. 1 is an explanatory view showing the structure of the plasma CVD apparatus of embodiment according to the present invention;

FIG. 2 is a front view of a feed-gas supplying electrode used in the plasma CVD apparatus of embodiment 1;

FIG. 10 is a front view of a ring spring used in the inner work holder;

FIG. 11 is a longitudinal cross-sectional view of another embodiment of the inner work holder;

FIG. 12 is a perspective view of a ring spring used in said another embodiment of the inner work holder;

FIG. 13 is a longitudinal cross sectional view of a further embodiment of the inner work holder;

FIG. 14 is a rear view of said further embodiment of the inner work holder;

FIG. 17A is an exploded front view of an outer work holder used in embodiment 4 of the plasma CVD apparatus;

FIG. 17B is a side view of the lower half-ring portion of the outer work holder of FIG. 17A;

FIG. 17C is an enlarged view of the portion B in FIG. 17B;

FIG. 17D is a right side view of the upper half-ring portion of the outer work holder of FIG. 17A;

FIG. 17E is a right side view of the lower half-ring portion of the outer work holder of FIG. 17A;

FIG. 20 is a cross-sectional view of of the plasma CVD apparatus of embodiment 5;

FIG. 21 is a cross-sectional view of a feed-gas supplying electrode having working areas on both the surfaces for use in the plasma CVD apparatus of embodiment 5;

FIG. 22 is a front view of a feed-gas supplying electrode used in the plasma CVD apparatus of embodiment 5;

FIG. 23 is a front view of a substrate holder and a carriage used in the plasma CVD apparatus of embodiment 5;

FIG. 24 is an explanatory view of another embodiment of the plasma CVD apparatus.

<BEST MODE CARRYING OUT THE INVENTION>

The embodiments according to this invention will be explained with reference to the drawings.

Embodiment 1

Figure 3:
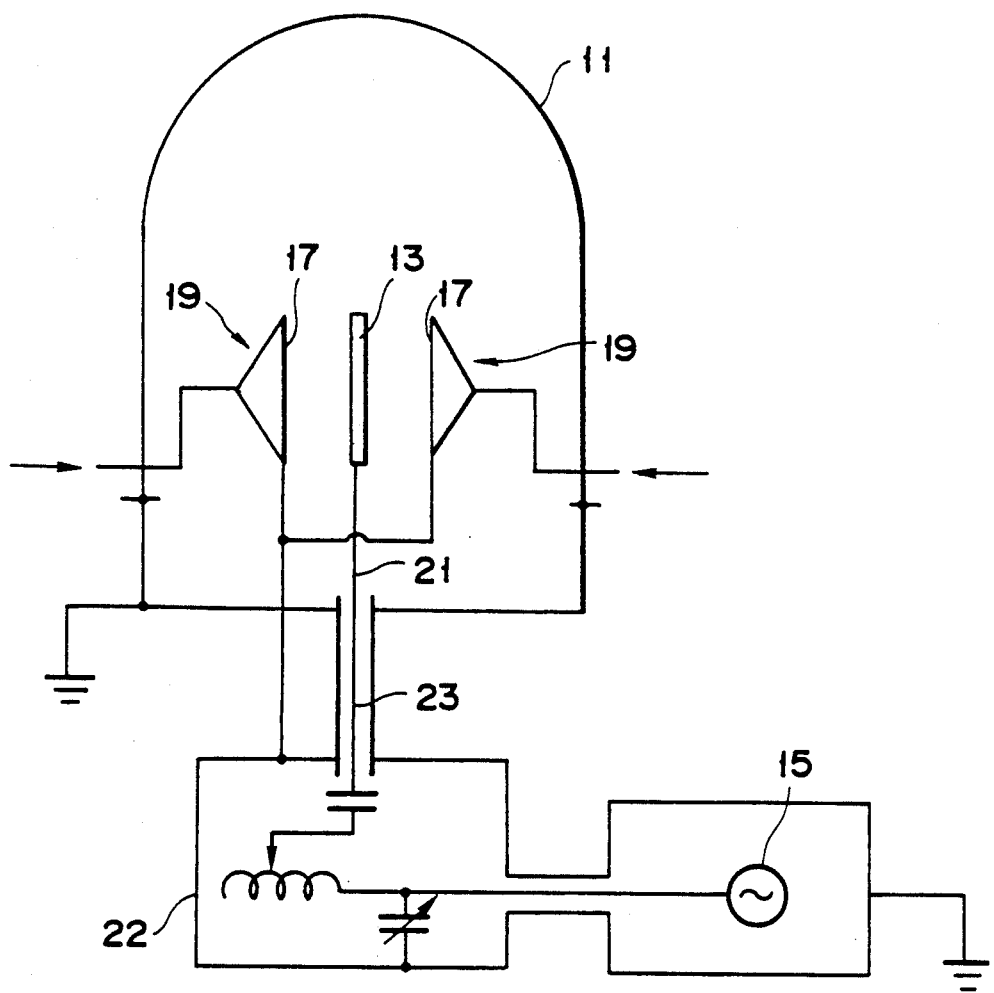
FIG. 3 shows an electric wiring system for the plasma CVD apparatus of embodiment 1.

FIG. 1 is an explanatory view of embodiment 1 of the plasma CVD apparatus according to this invention. In FIG. 1, a vacuum reaction chamber is denoted by 1, in which a pair of vertical feed-gas supplying electrodes 17 are provided in parallel so as to face each other. The feed-gas supplying electrodes 17 are made of meal and formed with a great number of gas supplying holes 18 so as to be uniformly distributed as shown in FIG. 2. On the rear face of each of the feed-gas supplying electrodes 17 is provided feed-gas supplying means 19 comprising a funnel-shaped gas supplying unit 19A made of metal, a metallic pipe 19B for supplying the feed gas thereto and a coupling 19C for connecting the unit 19A and the pipe 19B. The coupling 19C is connected to the pipe 19B in a fluid tightness. The gas supplying unit 19A is screwed to the coupling 19C so as to be moved back and forth. The pipe 19B is led outside of the vacuum reaction chamber 11. The feed-gas supplying electrodes 17 are electrically grounded by means of the feed-gas supplying means 19. A substrate 13 to be processed is supported by a metallic substrate holder 20 to be disposed in the central portion in the space defined by both the feed-gas supplying electrodes 17. The substrate holder 20 is detachably held by the top portion of an electrically conductive pole 21. A high frequency electric power is supplied to the substrate 13 from an external high frequency power source 15 through a matching box 22, a power supply wires 23, the electrically conductive pole 21 and the substrate holder 20. On the bottom is provided an evacuating pipe 24 connected to a vacuum pump (not shown) for evacuating the interior of the vacuum reaction chamber 11. FIG. 3 shows an electrical wiring system of the plasma CVD apparatus.

There will now be explained a method of forming a thin film by using the plasma CVD apparatus explained above. The interior of the vacuum reaction chamber 11 is evacuated to be held to approximately 0.1 Torr. Feed gas together with a carrier gas is fed from the feed-gas supplying means 19 onto both the faces of the substrate 13 through the gas supplying holes 18 in the feed-gas supplying electrodes 17. When a high frequency electric power is applied to the substrate 13, plasma is produced between the substrate 13 and the corresponding feed-gas supplying electrodes 17, and the plasma activates the feed gas supplied from the feed-gas supplying electrodes 17 into the plasma. As a result, a thin film is simultaneously formed on each of both surfaces of the substrate 13. In this case, the frequency of the high-frequency wave is 13.56 MHz. The high frequency electric power is electrically controlled so as to be applied the substrate 13 by matching box 22 and then applied to the substrate 13. Both the feed-gas supplying electrodes 17 are symmetrical with respect to the substrate 13. The evacuation is carried out at the center of the bottom of the vacuum reaction chamber 11 such that no deflection of the plasma density occurs in the plasma. After the supply of the feed gas has been stopped, the high frequency power source 15 is shut off, and the film formation is ended. In order to start the film formation, the high frequency electric power is applied to the substrate 13, and then the feed gas is supplied thereto. The substrate 13 is held in the same position during the film formation. It is preferred that the substrate 13 should be rendered as thin as possible so to prevent the disturbance of the feed gas flow in the vacuum.

Experiment 1 will be explained in which thin films were formed on substrates by using embodiment 1 of the

Experiment 1

The substrates 13 were aluminum discs having a diameter of 8.89 cm (3.5 inches), and the substrate holders 20 were made of stainless steel. The thickness of the substrate 13 was 1 to 2 mm. The distance between the substrates 13 and the corresponding feed-gas supplying electrodes 17 was 20 to 50 mm. Each feed-gas supplying electrode 17 was made of stainless steel and had an outer diameter not less than 20% larger than that of the substrate 13. The outer peripheral surface of the tubing 19B was wound by a heater, and the tube 19B as well as the heater was surrounded by electrically insulating material such as tetrafluoroethylene to hold the pipe 19B at a constant temperature.

Experiments were carried out under the following conditions, and thin films formed by plasma CVD could be obtained which had the film thickness and the distribution of film thickness as listed below.

| | |
|---|---|
| Film Forming Time | 30 seconds |
| High Frequency Electrical power | 150 W, 13.56 MHz |
| Temperature of the Pipe | 100° C. |
| Carrier Gas | Ar, 40 cc/min |
| Feed Gas | monomer which exhibits a gaseous phase at a high temperature |
| Thickness of the Formed Film | 300 Å |

-continued

| | |
|---|---|
| Distribution of the Film Thickness | 300 Å ± 5% |

Experiment 2

Figure 4:
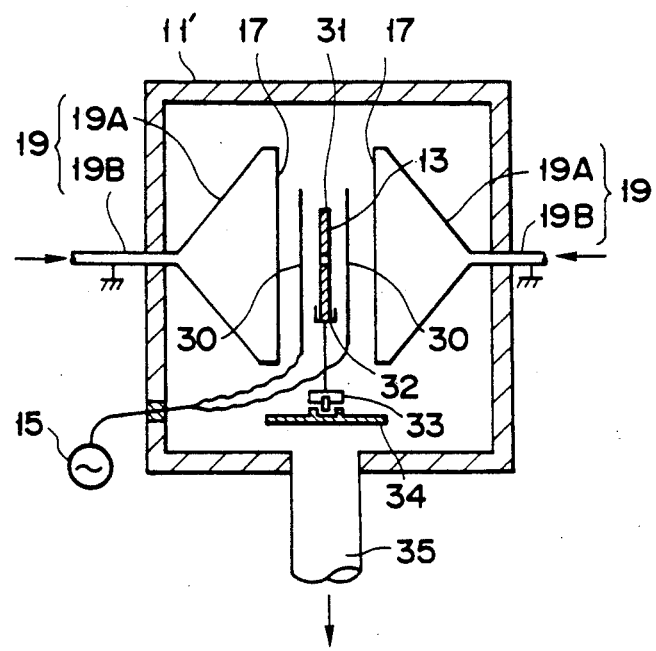
FIG. 4 is an explanatory view showing the structure of the plasma CVD apparatus of embodiment 2.
Figure 5:
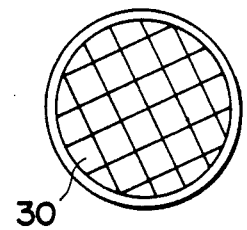
FIG. 5 is a front view of a meshed electrode used in the plasma CVD apparatus of embodiment 2.

FIG. 4 is an explanatory view of embodiment 2 of the plasma CVD apparatus. A pair of feed-gas supplying electrodes 17 and feed-gas supplying means 19 are provided in a vacuum reaction chamber 11'. Both the feed-gas supplying electrodes 17 and the feed-gas supplying means 19 have the same structures as those of embodiment 1. Therefore, their elements are denoted by the same referential numerals and their description will be omitted.

Between feed-gas supplying electrodes 17 are disposed a pair of vertical meshed electrodes 30 having a mesh structure such that they face each other and are placed in parallel to the feed-gas supplying electrodes 17. A high frequency electric power is applied from a high frequency power source (not shown) to each of the meshed electrodes 30. Between the meshed electrodes 30 is defined a substrate installing space 31 for placing the substrate 13 to be processed therein. In the substrate installing space 31, the substrate 13 is disposed vertically and in parallel to the respective meshed electrodes 30 such that it is separated from the facing meshed electrodes 30 at an equal spacing. The substrate 13 is supported by a holder 32 which is fixedly mounted on a carriage 33 running on a base 34. The bottom of the vacuum reaction chamber 11' has fixed thereto an evacuating pipe 35 connected to a vacuum pump (not shown) for evacuating the interior of the vacuum reaction pump 11, through the pipe 35.

With this plasma CVD apparatus, feed gas is supplied together with a carrier gas from both the feed-gas supplying means 19 to both the faces of the substrate 13 through feed-gas supplying holes 18 in the feed-gas supplying electrodes 17 and the meshed electrodes 30, and thereafter is applied with the high frequency electric power. Plasma is produced between the meshed electrodes 30 and the feed-gas supplying electrodes 17 opposed thereto. The feed gas is activated between them and forms a thin film on both the faces of the substrate 13. In this case, the frequency of the high frequency electric power applied to the meshed electrodes 30 is selected to be 13.56 MHz. The distance between the substrate 13 and the meshed electrodes 30 is selected to be 10 mm or less, and the substrate 13 is held in the plasma. The thin film formed on the substrate is harder when it is done by supplying the high frequency electric power to the meshed electrodes 30 than when it is done by applying the power to the ungrounded electrodes.

Experiment 2 will be explained in which thin films were formed on substrates by using embodiment 2 of the plasma CVD apparatus.

Experiment 2

The substrates 13 were aluminum discs having a diameter of 8.89 cm (3.5 inches), and the substrate holders 20 were made of stainless steel. The feed gas was supplied together with a carrier gas of Ar. The high frequency electric power was 100 W. The distance between the feed-gas supplying electrodes 17 was selected to be 40 to 50 mm, and the distance between the meshed electrodes 30 was 20 to 10 mm. Each substrates 13 was moved by a carriage 33 from a pretreatment room (not shown) to the center of the meshed electrodes 30 to be set there. After the film formation was carried out for 30 seconds, it was moved by the carriage 33 to an after-treatment room. The holder 32 was made of electrically insulating material, and the feed-gas supplying electrodes 17 and the meshed electrodes 30 were made of stainless steel. The flow of the carrier gas (Ar) and the feed gas was controlled by a mass-flow controller so as to be constant. The substrates 13 were heated in the pretreatment room (not shown) before the film formation, and then moved into the vacuum reaction chamber 11'. In the pretreatment room, the substrates 13 were heated by radiation. After the film formation in the vacuum reaction chamber 11', the substrates 13 were moved to the after-treatment room and exposed to an oxygen atmosphere. Thereafter, they were taken out from the after-treatment room.

If the number of meshes of the meshed electrodes is small, uniform plasma is not obtained. On the other hand, if the number of meshes is too large, monomer does not arrive on the substrate 13. After many experiments, it was determined that the number of meshes should be 5 to 50 meshes/2.54 cm.

Since the substrates 13 are always set in a predetermined position in the center of the space defined between the two meshed electrodes 30, it is preferred that the holder should have such a structure that it holds the whole periphery sides of the substrate 13.

When large feed-gas supplying electrodes 17 and large meshed electrodes 30 are used, film formation can be simultaneously carried out on both faces of a plurality of substrates 13.

Experiment 3

Figure 6:
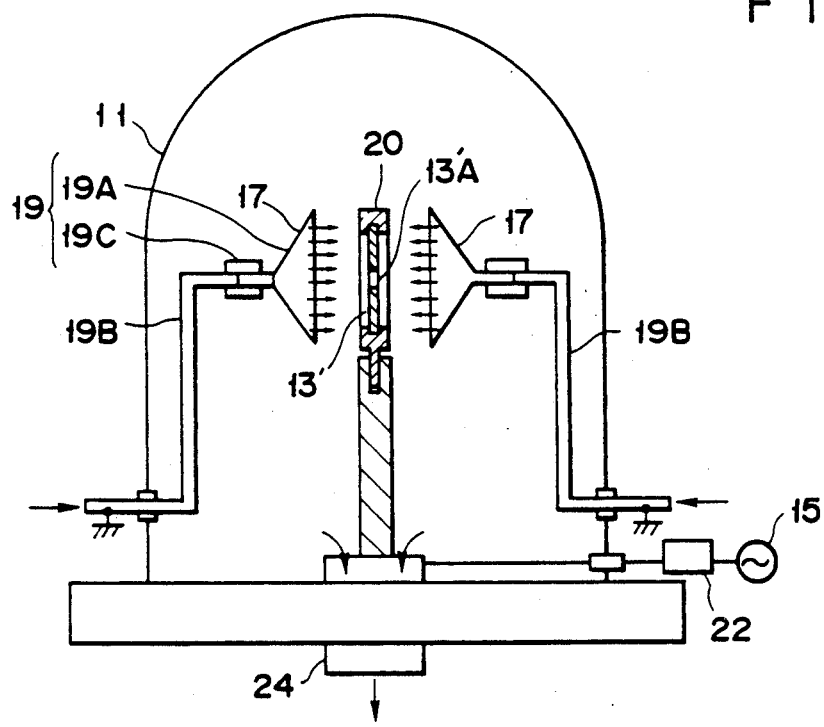
FIG. 6 is an explanatory view showing the plasma CVD apparatus of embodiment 3.

FIG. 6 is an explanatory view of embodiment 3 of the plasma CVD apparatus. A pair of feed-gas supplying electrodes 17 and feed-gas supplying means 19, which the plasma CVD apparatus comprises, have the same structures as those of embodiment 1. Thus, the same referential numerals are denoted to the same elements and their description will be omitted.

With this plasma CVD apparatus, plasma can be generated on both the faces of a substrate 13' by feed-gas supplying electrodes 17; feed gas ca be supplied from the feed-gas supplying electrodes 17 to the corresponding faces of the substrate 13'; and thin films are simultaneously formed on both the faces of the substrate 13'.

Referring to FIGS. 7 to 10, there will be described an inner work holder fitted in the central hole 13'A of a substrate 13' processed in the plasma CVD apparatus.

The inner work holder 39 has the substantially same thickness as that of the substrate 13' (for example, 1.35 mm) and is provided with a fit-engagement disc member 40 fitted in the central hole 13'A (whose inner diameter is 25 mm, for example) of the substrate 13'.

The fit-engagement disc member 40 comprises one end disc 40A and the other end disc 40B, which are incorporated by a boss 40C at their centers. The end disc 40A is formed slightly larger than the central hole 13'A of the substrate 13'. For example, the outer diameter of the end disc 40A is 25.4 mm, and the inner diameter of the central hole 13'A is 25 mm. The end disc 40A acts as a stopper means when the fit-engagement disc member 40 is inserted in the central hole 13'A of the substrate 13'. On the outer periphery of the larger end disc 40A is formed a tapered surface 40D which faces the other end disc 40B. The tapered surface 40D is shaped such that, when it is brought in contact with a tapered surface 13'B formed on an inner edge of the central hole 13'A of the substrate 13', the end disc 40A does not project from the surface of the substrate 13' too much. The other end disc 40B is formed slightly smaller than the central hole 13'A of the substrate 13'. For example, the inner diameter of the central hole 13'A is 25 mm, and the outer diameter of the end disc 40B is 24.6 mm so that the end disc 40B is easily inserted in the central hole 13'A. An annular groove 40E is defined by both the end discs 40A and 40B and the boss 40C. A pair of recesses 40F are formed in the outer peripheral wall of the boss 40C so as to be separated from each other for 180 degrees in the circumferential direction of the boss 40C. A ring spring 42 as expansible engaging means 41 is set in the annular groove 40E of the fit-engagement disc member 40. The ring spring 42 has a cut-away portion 42A and is engaged at its opposite portion to the portion 42B with the end disc 40A by means of a pin 43. A pair of operating arms 42B project inwardly from intermediate inner peripheral portions of the end disc 40A between the cut-away portion 42A and the pin 43, and are inserted in the recesses 40F of the boss 40C. Each operating arm 42B is formed with an operating hole 42C. The end disc 40A is provided with radially elongated holes 40G which correspond to the operating holes 42C.

Figure 8:
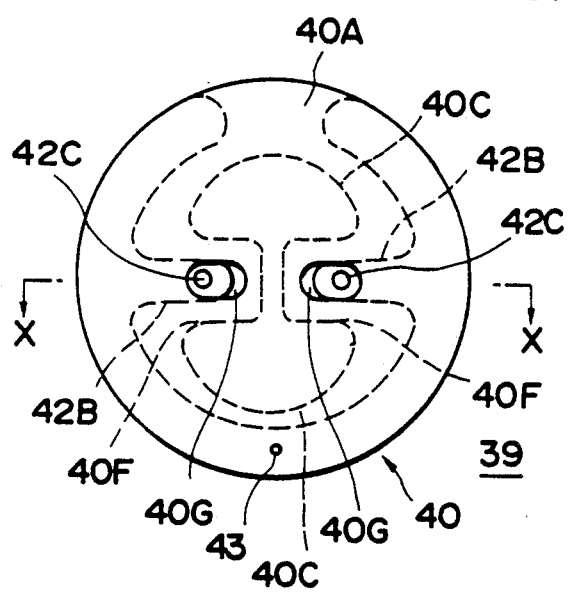
FIG. 8 is a front view of the inner work holder of FIG. 7.
Figure 9:
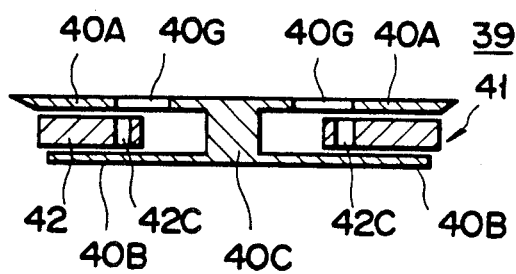
FIG. 9 is a cross-sectional view taken along the line X—X in FIG. 8.

The tips of pliers (not shown) are inserted in the operating holes 42C of the ring spring 42 through the elongated holes 40G and the ring spring 42 is shrunk by the pliers. In this state, the inner work holder 39 is inserted in the central hole 13'A of the substrate 13'. After the end disc 40A has been brought in contact with the surface of the substrate 13', the plier is removed. Then, the ring spring 42 is released and is pressed against the inner wall of the substrate 13'. Thus, the inner work holder 39 is engaged with the substrate 13'. In this state, as shown in FIG. 8, the inner work holder 39 blocks the central hole 13'A in such a manner that the outer surface of the holder 39 is substantially flush with the surface of the substrate 13'. Accordingly, when the thin films are formed on both the faces of the substrate 13' at the same time by the plasma CVD method, a uniform film is also formed on the inner wall of the central hole of the substrate.

FIGS. 11 and 12 show another inner work holder.

With the inner work holder 39', operating pins 44 are fitted in respective operating holes 42C formed in ring springs 42 which forms expansible engaging means so as to extend outwardly from an end disc 40A via elongated holes 40G.

With this structure, the ring spring 42 can be shrunk without using pliers, when the operating pins 44 are pushed towards each other by hand.

FIGS. 13 and 14 show a further inner work holder 39" in which assembling holes 45 are formed in the outer peripheral wall of a fit-engagement disc member 40 so as to be separated from each other for 90 degrees in the circumferential direction of the disc member 40. An expanding piece 46 is fitted in each of the assembling holes 45 such that a pressing portion 46A having a small diameter and formed on the tip of the expanding piece 46 extends outwardly from the outer peripheral wall of the fit-engagement disc member 40. In each of the assembling holes 45 is housed a coil spring 47 which biases the pressing portion 46A of the expanding piece 46 to cause it to extend from the outer peripheral wall of the fit-engagement disc member 40.

With the inner work holder 39", the fit-engagement disc member 40 is fixed to the substrate 13' only by inserting the fit-engagement disc member 40 into the central hole 13'A of the substrate 13' from the side of the end disc 40B.

Figure 7:
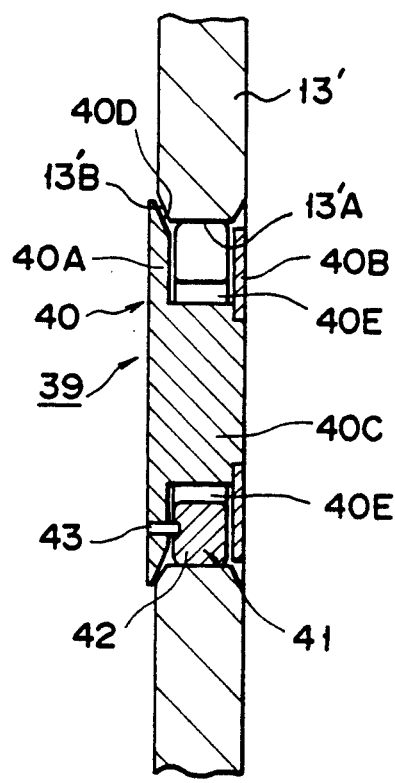
FIG. 7 is a longitudinal cross-sectional view of an inner work holder used in the the plasma CVD apparatus of embodiment 3.

When the inner work holders 39, 39' and 39" as shown in FIGS. 7 and 11 are used, the ring springs 42 can be removed from the substrate 13' by shrinking the ring springs 42 and then pulling it out. In the case of FIG. 13, however, the ring spring 42 can be removed from the substrate 13' only by pushing it out at the side of the end disc 40B.

Figure 15:
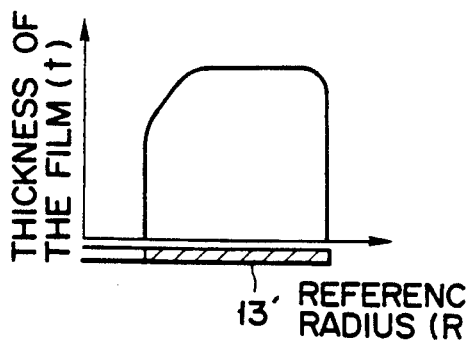
FIG. 15 shows a thickness characteristic of a thin film formed by a plasma CVD apparatus which does not employ an inner work holder.
Figure 16:
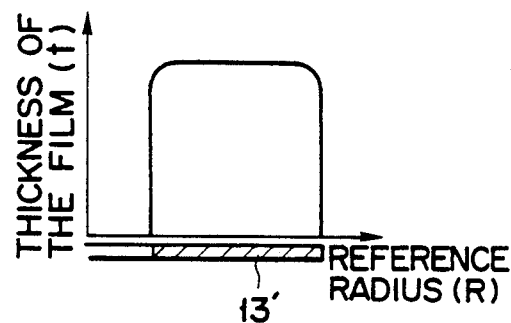
FIG. 16 shows a thickness characteristic of a thin film formed by a plasma CVD apparatus which uses an inner work holder.

The comparative tests were carried out for the plasma CVD film formation by using the inner work holders 39, 39' and 39" and without using them. The results are shown in FIGS. 15 and 16, respectively. FIG. 15 depicts the distribution of the film thickness when the inner work holders were not used. It shows that the film formed on the inside of the substrate 13' is thinner than the remaining portion. FIG. 16 shows the distribution of the film thickness when the inner work holders are used, indicating that the accuracy of the film thickness was ±5% within the area of 98% of the whole areas of the faces of the substrates 13'.

Embodiment 4

Since the general structure of embodiment 4 is similar to that of embodiment 3 as shown in FIG. 6, the description thereof will be replaced by that made to embodiment 3.

Referring to FIGS. 17A to 17E, there will be explained an outer work holder which is an essential element of embodiment 4 of the plasma CVD apparatus.

The outer work holder 58 comprises a ring-shaped outer holder body 59 and a fixing portion 60 for fixing the outer work holder body 59 to a supporting portion. The outer work holder body 59 is divided into an upper ring portion 59A and a lower ring portion 59B, both being connected to each other by female coupling elements 59C and male coupling elements 59D to form a ring. In the inner peripheral wall of the outer work holder 58 is formed a substrate receiving groove 59E in which the outer periphery of the substrate 13' is fitted. The outer work holder 59 is formed inside thereof with a uniformly thick portion 59F which has the substantially same thickness (for example, 1.4 mm) as the thickness of the substrate 13' (for example, 1.27 mm), and receives and surrounds the substrate 13'. It is preferred that the uniformly thick portion 59F should be thicker than the substrate 13' and thinner than 125% of the substrate 13'. It is also preferred that the outer diameter of the uniformly thick portion 59F should be not less than 120% of the outer diameter of the substrate 13'. When thin films were formed on both the faces of the substrates 13' on the outer work holder body 59 having the uniformly thick portion 59F of 110% of the thickness (1.4 mm) of the substrate 13' (whose thickness was 1.27 mm) and having 126% of the diameter (120 mm) of the substrate 13' (whose diameter was 95 mm) by using the plasma CVD apparatus as shown in FIG. 6, the distribution of the film thickness of an accuracy of ±5% could be obtained over 97% of the total surface of the substrates 13'.

It was found that, when the outer diameter of the uniformly thick portion 59F was smaller than 120% of the outer diameter of the substrate 13' or the thickness of the outer work holder body 59 is larger than 125% of the thickness of the substrate 13', the accuracy of the distribution of the film thickness at the peripheral portion of the substrate 13' was over ±5%.

Figure 18:
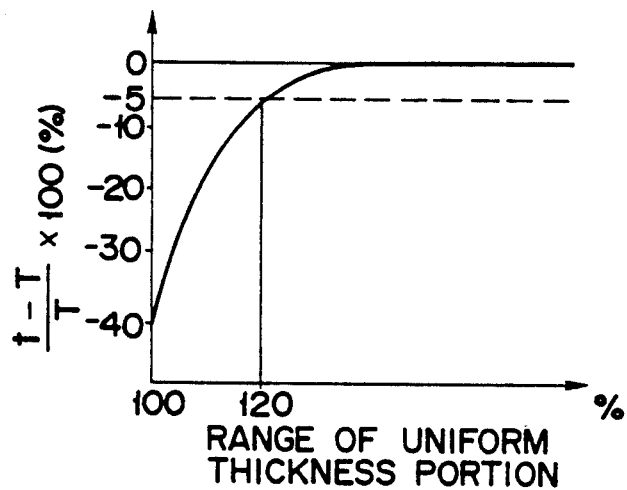
FIG. 18 shows a relation between the range of the uniformly thick portion of the outer work holder and the change of the thickness of the film at the peripheral portion of the substrate.
Figure 19:
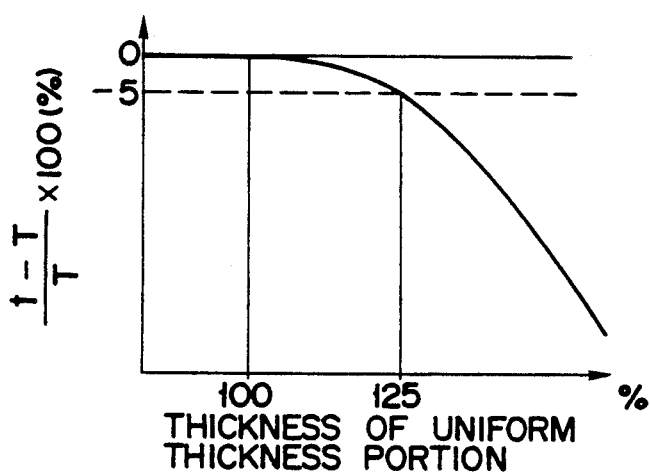
FIG. 19 shows a relation between the range of the uniformly thick portion of the outer work holder and the change of the thickness of the film at the peripheral portion of the substrate.

These test results are shown in FIGS. 18 and 19. FIG. 18 shows a relation of the change in the film thickness of the peripheral portion of the substrate 13', $(t-T)/T \times 100\%$, with the outer diameter of the uniformly thick portion 59F of the outer work holder 59, as a datum outer diameter, where the outer diameter of the substrate 13' was taken as 100% of the datum outer diameter, T was a film thickness at the middle portions of the radii of the substrate 13' and t was the film thickness at the portions of the substrate 13' by 3 mm inside of its outer periphery. From FIG. 18, it was found that the accuracy of the distribution of the film thickness exceeded 5% when the outer diameter of the uniformly thick portion 59F was smaller than 120% of the diameter of the substrate 13'.

FIG. 19 shows the relation of the change in the film thickness of the peripheral portion of the substrate 13' as described above, $(t-T)/T \times 100\%$, with the thickness of the uniformly thick portion 59F of the outer work holder body 59, as a datum thickness, where the thickness of the substrate 13' was taken as 100% of the datum thickness. From FIG. 19, it was found that the accuracy of the distribution of the film thickness exceeded ±5% when the thickness of the uniformly thick portion was more than 125% of the thickness of the substrate 13'.

The following test results were obtained when an experiment was made under the following conditions by using the inner work holder and the outer work holder in the plasma CVD apparatus.

| Film forming Time | 10 to 60 seconds |
| High Frequency Electrical Power | 150 W, 13.56 MHz |
| The Temperature of the Pipe | 100° C. |
| Carrier Gas | Ar, 40 cc/min |
| Feed Gas | 40 cc/min |

The feed gas was prepared by the processes in which dibenzyl ($C_6H_5$—$CH_2$—$CH_2$—$C_6H_5$) in a solid state at a room temperature was put in a container and heated at a temperature of 150° C. to be liquefied. Then, the dibenzyl was bubbled by Ar in the container. After being changed into a gaseous state, the dibenzyl was added to by Ar gas as a carrier gas and supplied to the electrodes. The diameter of the portion of the pipe near the bell jar was selected so that dibenzyl was not liquefied or solidified at a temperature of 100° C.

Figure 25:
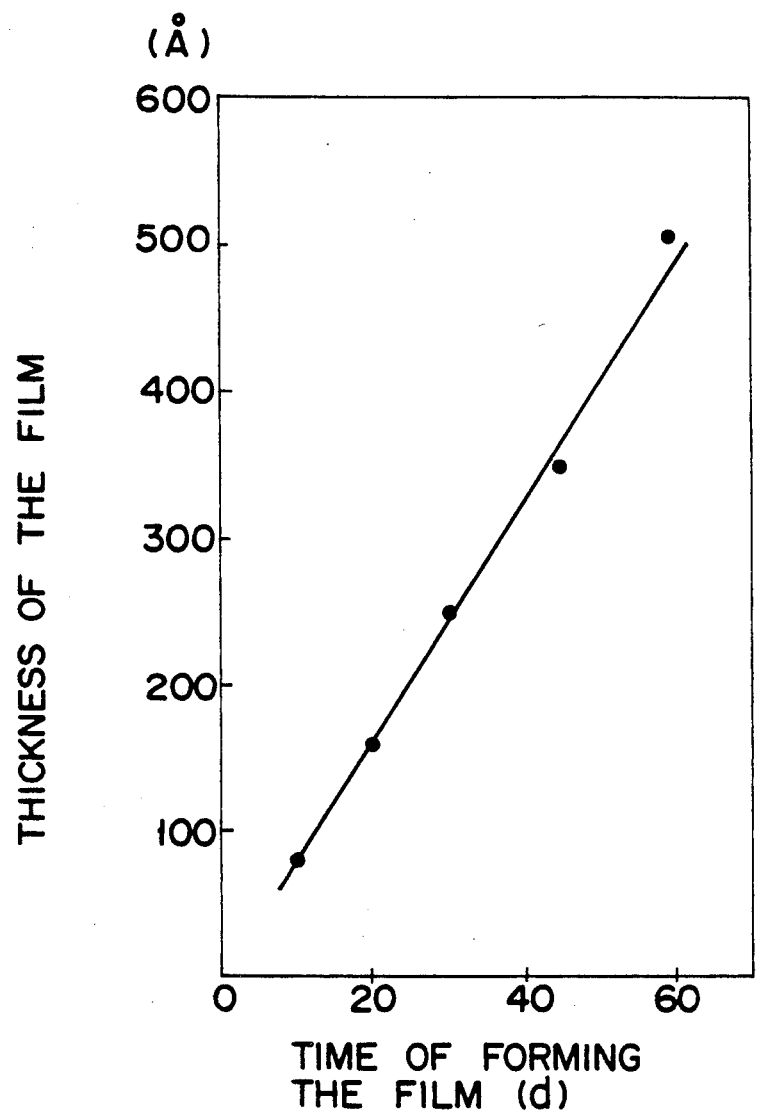
FIG. 25 is a characteristic chart between the thickness of the film formed by a plasma CVD apparatus having inner and outer work holders and the film forming time.

From FIG. 25, it was found that the thickness of the film was proportional to the film forming time. It means that the use of the inner work holder and the outer work holder caused the feed gas to flow stably on the substrate and a constant film formation condition was obtained.

Table 1 shows the comparative data between the film (hereinafter referred to as "PP film" of this invention) formed according to this invention and a film (hereinafter referred to as "carbon film+lubricant") formed by forming a carbon film on a magnetic film by the sparttering method, and then coating lubricant thereon.

TABLE 1

| | Films | |
| --- | --- | --- |
| Character-istics | (This Invention) PP Film | (Comparative) Sample Carbon Film + Lubricant |
| Surface Smoothness | O | X |

TABLE 1-continued

| | Films | |
|---|---|---|
| Character-istics | (This Invention) PP Film | (Comparative) Sample Carbon Film + Lubricant |
| at a low speed (1 rpm) Surface Smoothness | O | X |
| at a high speed | (2 to 4 × 10⁵) | (1 to 3 × 10⁴) |
| Sticking | O | X |
| Corrosion Resistance | O (No Problem) | X (With Problem) |

The tests of the surface roughness at a high speed were made on an abrasion test head disposed on the discs under the following conditions:

| Size of the head | 5 mm × 5 mm |
|---|---|
| Weight of the head | 15 gf |
| sliding speed of the discs | 10 m/s |

The test results were as follows:

| PP film (this invention) | 2 to 4 × 10⁵ times |
|---|---|
| Carbon + Lubricant (comparative sample) | 1 to 3 × 10⁴ times |

Sticking is a phenomenon that a disc is attached to a head when the disc is stopped moving. The PP film was not suffered from the sticking, but the carbon film+lubricant was stuck to the disk.

The corrosion resistive tests were made under the following conditions:

| Condition 1 | | Condition 2 | |
|---|---|---|---|
| Temperature | 80° C. | Temperature | 25° C. |
| Relative Humidity | 80% | Relative Humidity | 50% |

The changes from condition 1 to condition 2 and vice versa were repeated at a cycle of two hours. In other words, the tests of changing the circumstances of the discs at the cycle of two hours were repeated.

These tests are very severe circumferential tests, and, if the protecting films are insufficiently formed, the discs are corroded, whereby the films are swelled or fall off from the discs.

As the results of the tests, no trouble occurred to the PP films, but a little corrosion occurred to the carbon films+lubricant.

Embodiment 5

FIG. 20 is a cross-sectional view of embodiment 5 of the plasma CVD apparatus. A vacuum reaction chamber is designated at 70 and is grounded. In the vacuum reaction chamber 70 are disposed a feed-gas supplying electrode 77 having working faces on both sides and a feed-gas supplying electrode 78 having a working face on one side such that they are vertically arranged opposed to and in parallel to each other. As shown in FIG. 21, the feed-gas supplying electrode 77 having the working faces on both sides comprises a metallic distribution-chamber forming member 79a having inverted conical surfaces formed on both faces and a metallic feed-gas supplying electrode body 80 having the member 79b inserted therein. As shown in FIG. 22, a great number of gas supplying holes 81 are distributed in the feed-gas supplying electrode body 80. The feed gas flows out from the electrode faces 80A.

Each of the feed-gas supplying electrodes 78 having a working face comprises a metallic distribution-chamber forming member 82 having an inverted conical surface formed on one side thereof and a feed-gas supplying electrode body 83 surrounding the member 82. The inverted conical surface and the inner peripheral wall of the body 83 define a conical distribution chamber. A great number of gas supplying holes 84 are distributed in the feed-gas supplying electrode body 83. The feed gas flows out from the electrode surface 83A of each feed-gas supplying electrode body 83. Metallic feed-gas supplying pipes 86 and 87 are connected to the feed-gas supplying electrodes 77 and 78, respectively. Various kinds of feed gas such as monomer of benzine group are used. The feed-gas supplying pipes 86 and 85 penetrate the vacuum reaction chamber 70 in an air-tight state. The feed-gas supplying electrodes 77 and 78 are grounded via the fed-gas supplying pipes 86 and 85 and the vacuum reaction chamber 70. With this embodiment, substrates 13' to be processed are supported by metallic substrate holders 87 at the centers of the spaces between the facing electrode surfaces 80A and 83A of the feed-gas supplying electrodes 77 and 78, and each substrate holder 87 supports two substrates 13' so that both the right and left faces of each substrate 13' are exposed, as shown in FIG. 23. The holder 87 is fixed onto a carriage 88 which runs on a base 89 to bring the holder 78 in the vacuum reaction chamber 70 or move the same outside of the chamber 70. A high frequency electric power is applied to the substrates 13' from external plasma electric sources 75 such as high frequency electric power sources via matching boxes 90, electric wires 91 and the substrate holders 87. On the bottom of the vacuum reaction chamber 70 is provided a vacuum pipe 92 connected to a vacuum pump (not shown) for evacuating the interior of the vacuum reaction chamber 70. A pretreatment chamber (not shown) and an after-treatment chamber for stabilizing the films (not shown) are connected to the vacuum reaction chamber 70 via gate valves.

There will be explained the processes for forming the thin films by using the CVD apparatus. The interior of the vacuum reaction chamber 70 is evacuated to be held at approximately 0.1 Torr. The feed gas together with the carrier gas is supplied to both the faces of each substrate 13' through the feed-gas supplying holes 81 and 84 in the feed-gas supplying electrodes 77 and 78. The volume of the feed gas supplied to the pipe 86 is as double as that supplied to the pipe 85. When a high frequency electric power of 100 to 150 W is supplied to the substrates 13' from the plasma electric sources 75, plasma is generated between the substrates 13' and the feed-gas supplying electrodes 77 and 78 at both the sides of each substrate 13'. The feed gas supplied from the feed-gas supplying electrodes 77 and 78 is activated in the plasma and forms thin films on both the faces of each substrate 13'. In this case, the frequency of the high frequency electric power applied to the substrates 13' is 13.56 MHz. The high frequency electric power is applied to the substrates 13' after it has electrically been matched. The feed-gas supplying electrodes 77 and 78 are symmetrical with respect to the respective substrates 13'. The same amount of the feed gas is supplied to both the substrates 13', and the distance between the electrodes 77 and 78 and the corresponding substrates is also the same. Evacuation is carried out at the center of the bottom of the vacuum reaction chamber 70 so that no adverse effect due to deflection appears in the plasma.

The film forming time is approximately 30 seconds. After the film formation, the supply of the feed gas is stopped and then the plasma electric sources 75 are shut off. The film formation starts by supplying the feed gas to the substrates 13 after the high frequency electric power has been applied thereto. The substrates 13' are held in the same positions during the film formation. It is preferred that the substrate holders 87 should be rendered as thin as possible to avoid the flow disturbance of the feed gas.

FIG. 24 shows another plasma CVD apparatus. The elements of this apparatus which correspond to those of the embodiment as shown in FIG. 20 are denoted by the same referential numerals as in FIG. 20. With this embodiment, two feed-gas supplying electrodes 77 are arranged in parallel to each other and substrates 13' can be processed in three positions.

The films are simultaneously formed on more substrates 13' with this arrangement than with the other embodiments.

<INDUSTRIAL APPLICABILITY>

The method and apparatus for forming a thin film by plasma CVD according to this invention provides for easy formation of solid and fine thin films, which have corrosion-resistive and abrasion resistive-properties, on a substrate. Therefore, this invention is very useful in the field of manufacturing a magnetic disc or the like.

What is claimed is:

1. An apparatus for forming a thin film by plasma CVD, comprising:
   feed-gas supplying electrodes disposed facing each other at a predetermined spacing in a vacuum reaction chamber;
   feed-gas supplying means connected to said feed-gas supplying electrodes;
   supporting means for supporting an object to be processed in a predetermined position between said feed-gas supplying electrodes;
   high frequency electric power supplying means for supplying a predetermined high frequency electric power to said object to be processed while said feed-gas supplying electrodes are being grounded;
   a fit-engagement disc member having substantially the same thickness as that of said object to be processed and fitted in a central hole formed in said object; and
   an inner work holder comprising expansible engaging means mounted on an outer periphery of said fit-engagement disc member and supporting said object to be processed thereon.

2. The apparatus for forming a thin film by plasma CVD according to claim 1, wherein said expansible engaging means comprises a spring for biasing said fit-engagement disc member and supporting the same on said object to be processed.

3. The apparatus for forming a thin film by plasma CVD according to claim 1, wherein said object to be processed is made of material for a magnetic disc.

4. An apparatus for forming a thin film by plasma CVD comprising:
   feed-gas supplying electrodes disposed facing each other in a predetermined spacing in a vacuum reaction chamber;
   feed-gas supplying means connected to said feed-gas supplying electrodes;
   supporting means for supporting an object to be processed in a predetermined position between said feed-gas supplying electrodes;
   high frequency electric power supplying means for supplying a high frequency electric power to said object to be processed while said feed-gas supplying electrodes are being grounded; and
   an annular outer work holder provided with a uniformly thin portion having substantially the same thickness as that of said object to be processed and abutting against an outer surface thereof, said outer work holder being adapted to hold said object to be processed such that both faces of said object to be processed are exposed.

5. The apparatus for forming a thin film by plasma CVD according to claim 4, wherein said object to be processed is made of material of a magnetic disc.

* * * * *